(12) United States Patent
Hartmann et al.

(10) Patent No.: US 9,276,223 B2
(45) Date of Patent: Mar. 1, 2016

(54) DOPANT FOR A HOLE CONDUCTOR LAYER FOR ORGANIC SEMICONDUCTOR COMPONENTS, AND USE THEREOF

(71) Applicant: OSRAM Opto Semiconductors GmbH, Regensburg (DE)

(72) Inventors: David Hartmann, Erlangen (DE); Sabine Szyszkowski, Dachsbach (DE); Andreas Kanitz, Hoechstadt (DE); Anna Maltenberger, Leutenbach (DE); Wiebke Sarfert-Gast, Herzogenaurach (DE); Guenter Schmid, Hemhofen (DE); Jan Hauke Wemken, Nuremberg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/633,609

(22) Filed: Feb. 27, 2015

(65) Prior Publication Data

US 2015/0200374 A1     Jul. 16, 2015

Related U.S. Application Data

(63) Continuation of application No. 13/638,596, filed as application No. PCT/EP2011/001645 on Mar. 31, 2011, now Pat. No. 9,006,716.

(30) Foreign Application Priority Data

Mar. 31, 2010  (DE) .......................... 10 2010 013 495

(51) Int. Cl.
*H01L 35/24*      (2006.01)
*H01L 51/00*      (2006.01)
(Continued)

(52) U.S. Cl.
CPC .......... *H01L 51/0091* (2013.01); *C09B 57/008* (2013.01); *C09K 11/06* (2013.01);
(Continued)

(58) Field of Classification Search
CPC .................................................... H01L 51/0091
USPC ........................................................... 257/40
See application file for complete search history.

(56) References Cited

U.S. PATENT DOCUMENTS

2008/0030125 A1   2/2008  Boerner et al.
2009/0035675 A1   2/2009  Wu

FOREIGN PATENT DOCUMENTS

CN           1882673 A      12/2006
DE     102008051737 A1      5/2009
(Continued)

OTHER PUBLICATIONS

He, G. et al., "Very high-efficiency and low voltage phosphorescent organic light-emitting diodes based on a p-i-n junction," Journal of Applied Physics, vol. 95, No. 10, May 15, 2004, pp. 5773-5777.

(Continued)

*Primary Examiner* — Anthony Ho
(74) *Attorney, Agent, or Firm* — Slater & Matsil, L.L.P.

(57) ABSTRACT

The invention relates to novel metal-organic materials for hole injection layers in organic electronic components. For example, in light-emitting components such as organic light diodes (OLED) or organic light-emitting electrochemical cells (OLEEC) or organic field effect transistors or organic solar cells or organic photo detectors. Luminescence (cd/m$^2$), efficiency (cd/A), and service life (h) of organic electronic components such as from organic light diodes in particular are highly dependent on the exciton thickness in the light-emitting layer and on the quality of the charge carrier injection and are also limited by same, among other things. The invention relates to a hole injection layer consisting of quadratic planar mononuclear transition metal complexes such as copper 2+ complexes, for example, which are embedded into a hole-conducting matrix.

10 Claims, 4 Drawing Sheets

(51) Int. Cl.
*C09K 11/06* (2006.01)
*C09B 57/00* (2006.01)
*H01L 51/50* (2006.01)

(52) U.S. Cl.
CPC ......... *H01L 51/002* (2013.01); *H01L 51/0032* (2013.01); *H01L 51/5092* (2013.01); *C09K 2211/1007* (2013.01); *C09K 2211/1011* (2013.01); *C09K 2211/1014* (2013.01); *C09K 2211/188* (2013.01); *H01L 51/0092* (2013.01); *H01L 51/504* (2013.01); *H01L 51/506* (2013.01); *H01L 51/5088* (2013.01); *Y02E 10/549* (2013.01)

(56) References Cited

FOREIGN PATENT DOCUMENTS

| | | |
|---|---|---|
| JP | 2011060998 A | 3/2011 |
| WO | 03022008 A1 | 3/2003 |
| WO | 2011033023 A1 | 3/2011 |

OTHER PUBLICATIONS

Kodas, T., et al., "The Chemistry of Metal CVD," VCH 1994, ISBN: 3-527-290710, 17 pages.

Laskar, I., et al., "Highly efficient orange-emitting OLEDs based on phosphorescent platinum (II) complexes," Polyhedron, vol. 24, 2005, pp. 881-888.

Parshall, G., et al., "Bis(1,1,1,5,5,5-Hexafluoro-2,4-Pentanedionato)-Nickel(II) and-Cobalt(II): (Nickel and Cobalt Hexafluoroacetylaetonates)," Inorganic Synthesis, vol. XV, XP-002648350, ISBN: 9780470132463, 1974, pp. 96-100.

Vigato, P., et al., "The evolution of β-diketone or β-diketophenol ligands and related complexes," Coordination Chemistry Reviews, vol. 253, Apr. 2009, pp. 1099-1201.

Williams, J.A., et al., "Optimising the luminescence of platinum(II) complexes and their application in organic light emitting devices (OLEDs)," Coordination Chemistry Reviews, vol. 252, Dec. 2008, pp. 2596-2611.

DOPANT FOR A HOLE CONDUCTOR LAYER FOR ORGANIC SEMICONDUCTOR COMPONENTS, AND USE THEREOF

This application is a continuation of U.S. patent application Ser. No. 13/638,596, filed on Jan. 9, 2013, entitled, "Dopant for a Hole Conductor Layer for Organic Semiconductor Components, and Use Thereof," which is a national phase filing under section 371 of PCT/EP2011/001645, filed Mar. 31, 2011, which claims the priority of German patent application 10 2010 013 495.3, filed Mar. 31, 2010, each of which is incorporated herein by reference in its entirety.

TECHNICAL FIELD

The invention relates to novel organometallic materials for hole injection layers in organic electronic components, especially in light-emitting components such as organic light-emitting diodes (OLEDs) or organic light-emitting electrochemical cells (OLEECs) or organic field-effect transistors or organic solar cells or organic photodetectors.

BACKGROUND

Doping of organic materials with electron acceptors to increase the conductivity of hole conductor layers has been demonstrated many times in the literature (see, for example, G. He, 0. Schneider, D. Qin, X. Zhou, M. Pfeiffer, and K. Leo, Journal of Applied Physics, 95, 5773-5777 (2004)).

Doping can increase the conductivity of the material by orders of magnitude.

There is a fundamental need for further dopants, particularly inexpensive dopants, for hole transport layers.

SUMMARY OF THE INVENTION

In one aspect the present invention provides further dopants for use in hole conductor materials.

The solution to the problem, and the subject matter of the invention, is therefore the provision of a doped hole conductor layer for use in organic electronic components, at least comprising a hole-conducting matrix and a square-planar mononuclear transition metal complex as dopant. Another problem addressed by the present invention is that of specifying the use of such a hole conductor layer, and finally an organic electronic component.

BRIEF DESCRIPTION OF THE DRAWINGS

The more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
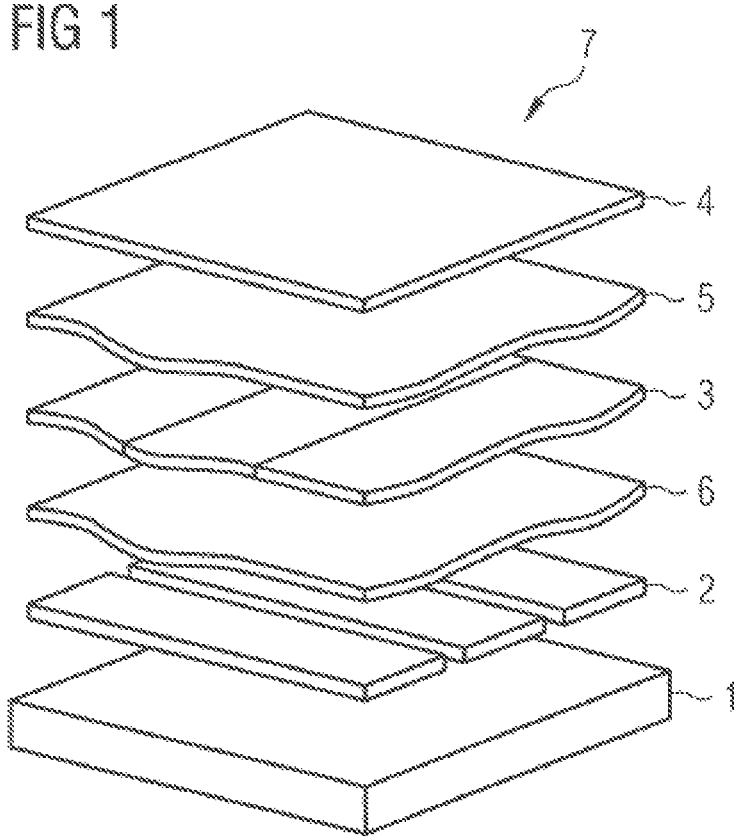
FIG. 1 shows the structure of an OLEEC in schematic form.

In one embodiment of the invention, the dopant is a square-planar mononuclear transition metal complex with a copper, palladium, platinum, cobalt or nickel atom as the central atom.

A square-planar complex form refers here to any complex form which differs from the tetrahedral complex configuration, according to a crystal structure analysis, by more than the usual measurement inaccuracies. In no case is it restricted to a flat arrangement of ligands around the central atom.

Preference is given to those ligands which have a relatively low LUMO compared to the hole-conducting matrix, since these compounds are characterized by a higher Lewis acidity in the matrix. Thus, the doping effect therein is particularly pronounced.

Due to the square-planar character, the complexes, given the same empirical formula, may be present in the cis or trans form thereof. In general, especially in the case of small substituents R, both isomers give equally good doping. Only the trans isomer is discussed hereinafter to represent both isomers.

One example of the entire class of square-planar transition metal complexes is the class of mononuclear complexes with copper 2+ as the central atom.

To consolidate the square-planar character of the compound, bridged or "bidentate" ligands, for example acetylacetonate, are preferred. In the case of copper as the central atom, this is of course more important than, for example, in the case of palladium, since the latter in any case exhibits a tendency to form square-planar metal complexes.

General structural formula I

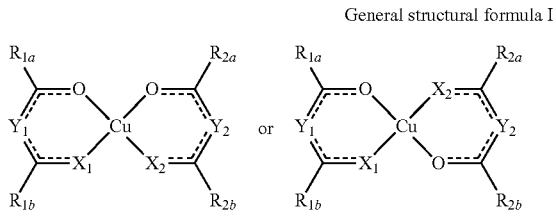

The formula I shows an example of the inventive square-planar copper (II) complexes. For the same empirical formula, the complex may be present in the cis or trans form.

In the structural formula I, the $Y_1$ or $Y_2$ bridge may independently consist of N or C—R where R may be any aliphatic or aromatic substituent as discussed below for $R_{1a}$, $R_{1b}$, $R_{2a}$ and $R_{2b}$.

The bridge is more preferably C—H. This is used in all working examples.

$X_1$ and $X_2$ may each independently be O or N—R where R may be any aliphatic or aromatic substituents as will be discussed later, for example, for $R_{1a}$, $R_{1b}$, $R_{2a}$ and $R_{2b}$. Particularly, preferred is $X_1$, $X_2$=O. In this case, when $Y_i$=C—R (i=1 and/or 2), acetonylacetonate complexes are formed. Especially the electron-deficient representatives of this class form a preferred class within the dopants disclosed herein for hole conductor materials. When $X_i$=N—R (i=1 and/or 2), Schiff base complexes are formed.

The substituents $R_{1a}$, $R_{1b}$, $R_{2a}$ and $R_{2b}$ may each independently be hydrogen or deuterium, methyl, ethyl, and generally unbranched, branched, fused (decahydronaphthyl), cyclic (cyclohexyl) or fully or partly substituted alkyl radicals ($C_1$-$C_{20}$). These alkyl radicals may contain ether groups (ethoxy, methoxy, etc.), ester, amide, carbonate groups, etc., or else halogens, especially F. Also within the scope of the invention are substituted or unsubstituted aliphatic rings or ring systems, such as cyclohexyl.

$R_{1a}$, $R_{1b}$, $R_{2a}$ and $R_{2b}$ are not restricted to saturated systems, but also include substituted or unsubstituted aromatics such as phenyl, biphenyl, naphthyl, phenanthryl etc. or benzyl etc. A list of heterocycles useful as substituents is shown in Table 1. For the sake of simplicity, only the base structure of the aromatics is shown. In principle, this base structure may be substituted by further R radicals which can be derived analogously from the $R_{1a}$, $R_{1b}$, $R_{2a}$ and $R_{2b}$ radicals defined here.

TABLE 1
Furan
Thiophene
Pyrrole
Oxazole
Thiazole
Imidazole
Isoxazole
Isothiazole
Pyrazole
Pyridine
Pyrazine
TABLE 1-continued
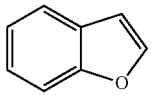
Pyrimidine
1,3,6 Triazine
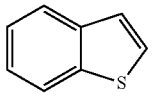
Pyrylium
alpha-Pyrone
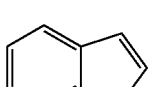
gamma-Pyrone
Benzo[b]furan
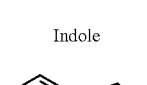
Benzo[b]thiophene
Indole
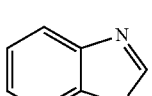
2H-isoindole
Benzothiazole TABLE 1-continued
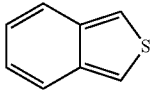
2-benzothiophene
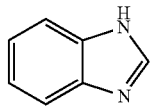
1H-benzimidazole
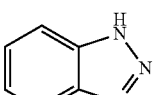
1H-benzotriazole
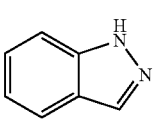
1H-indazole
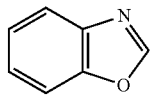
1,3-benzoxazole
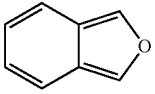
2-benzofuran
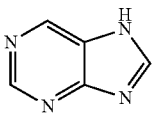
7H-purine
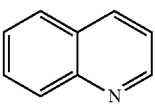
Quinoline
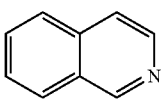
Isoquinoline
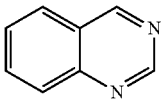
Quinazoline
TABLE 1-continued
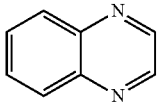
Quinoxaline
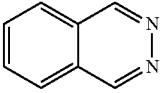
phthalazine
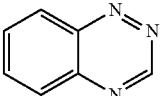
1,2,4-benzotriazine
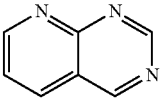
Pyrido[2,3-d]pyrimidine
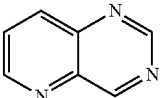
Pyrido[3,2-d]pyrimidine
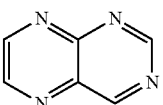
pteridine
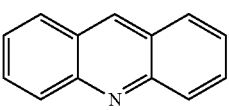 [SMILES: c1ccc2nc3ccccc3cc2c1]
acridine
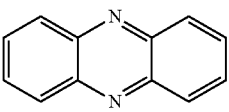 [SMILES: c1ccc2nc3ccccc3nc2c1]
phenazine
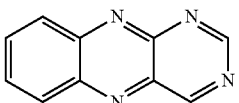
benzo[g]pteridine
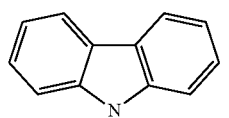
9H-carbazole TABLE 1-continued

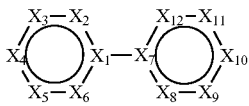

Bipyridine & derivatives
(0-2)(/ring = N)

Table 1 shows a selection of substituted or unsubstituted heterocycles which are independently useful as $R_{1a}$, $R_{1b}$, $R_{2a}$ and $R_{2b}$ radicals. For the sake of simplicity, only the base unit is shown. The bond to the ligand may be at any bondable site on the base structure. Very particularly preferred are the electron-deficient variants when the substituents $R_{1a}$, $R_{1b}$, $R_{2a}$ and $R_{2b}$ bear electron-withdrawing substituents with fluorine directly on the bonding carbon (see formula 3.3a to 3.3c).

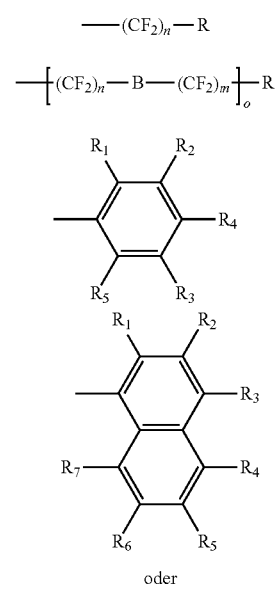

In Formula III shows various types of particularly preferred substituents for the $R_{1a}$, $R_{1b}$, $R_{2a}$ and $R_{2b}$ radicals.

In formula 3.3a, n may be 1 to 20; more preferably, n=2 with R=F. Otherwise, R may be selected like the $R_{1a}$, $R_{1b}$, $R_{2a}$ and $R_{2b}$ radicals. Particular preference is given here to aliphatic chains and/or aromatics.

In formula 3.3b, n, m, o may independently be 0 to 20, but more preferably n=m=2 and o is in the range from 1 to 5 with R=F and B=O. Otherwise, R may be selected like the $R_{1a}$, $R_{1b}$, $R_{2a}$ and $R_{2b}$ radicals. Particular preference is given here to aliphatic chains and/or aromatics.

In formula 3.3c, $R_1$ to $R_7$ may each independently be selected like the $R_{1a}$, $R_{1b}$, $R_{2a}$ and $R_{2b}$ radicals. Particular preference is given, however, to fully or partly fluorinated systems with $R_1$ to $R_7$ each independently H or F.

The syntheses of the complexes will not be discussed in any detail since they have been studied very thoroughly (citation: book "The Chemistry of Metal CVD, T. Kodas, M. Hampden Smith, VCH 1994, ISBN 3-527-29071-0, pages 178-192). More particularly, these complexes are utilized as precursors for copper CVD (chemical vapour deposition) in the semiconductor industry. Many volatile derivatives are therefore commercially available.

For production of the hole transport layer, the inventive materials are incorporated into the hole transport material by doping in a concentration of 0.1-50%, preferably 5%-30%. The layer can be deposited either from the gas phase or liquid phase.

Useful hole transporters which are deposited from the gas phase include here, but without restriction:
N,N'-bis(naphthalen-1-yl)-N,N'-bis(phenyl)-9,9-dimethylfluorene
N,N'-bis(3-methylphenyl)-N,N'-bis(phenyl)-9,9-diphenylfluorene
N,N-bis(naphthalen-1-yl)-N,N'-bis(phenyl)-9,9-diphenylfluorene
N,N'-bis(naphthalen-1-yl)-N,N'-bis(phenyl)-2,2-dimethylbenzidine
N,N'-bis(3-methylphenyl)-N,N'-bis(phenyl)-9,9-spirobifluorene
2,2',7,7'-tetrakis(N,N-diphenylamino)-9,9'-spirobifluorene
N,N'-bis(naphthalen-1-yl)-N,N'-bis(phenyl)benzidine
N,N'-bis(naphthalen-2-yl)-N,N'-bis(phenyl)benzidine
N,N'-bis(3-methylphenyl)-N,N-bis(phenyl)benzidine
N,N-bis(3-methylphenyl)-N,N'-bis(phenyl)-9,9-dimethylfluorene
N,N'-bis(naphthalen-1-yl)-N,N'-bis(phenyl)-9,9-spirobifluorene
Di-[4-(N,N-ditolylamino)phenyl]cyclohexane
2,2',7,7'-tetra(N,N-ditolyl)amino-spiro-bifluorene
9,9-bis[4-(N,N-bisbiphenyl-4-yl-amino)phenyl]-9H-fluorene
2,2',7,7'-tetrakis[N-naphthalenyl(phenyl)amino]-9,9-spirobifluorene
2,7-bis[N,N-bis(9,9-spirobifluorene-2-yl)amino]-9,9-spirobifluorene
2,2-bis[N,N-bis(biphenyl-4-yl)amino]-9,9-spirobifluorene
N,N'-bis(phenanthren-9-yl)-N,N'-bis(phenyl)benzidine
N,N,N',N'-tetranaphthalen-2-yl-benzidine
2,2'-bis(N,N-diphenylamino)-9,9-spirobifluorene
9,9-bis[4-(N,N-bisnaphthalen-2-yl-amino)phenyl]-9H-fluorene
9,9-bis[4-(N,N'-bisnaphthalen-2-yl-N,N'-bisphenylamino)phenyl]-9H-fluorene
titanium oxide phthalocyanine
copper phthalocyanine
2,3,5,6-tetrafluoro-7,7,8,8-tetracyanoquinodimethane
4,4',4"-tris(N-3-methylphenyl-N-phenylamino)triphenylamine
4,4',4"-tris(N-(2-naphthyl)-N-phenylamino)triphenylamine
4,4',4"-tris(N-1-naphthyl)-N-phenylamino)triphenylamine
4,4',4"-tris(N,N-diphenylamino)triphenylamine
Pyrazino[2,3-f][1,10]phenanthroline-2,3-dicarbonitrile
N,N,N',N'-tetrakis(4-methoxyphenyl)benzidine
2,7-bis[N,N-bis(4-methoxyphenyl)amino]-9,9-spirobifluorene
2,2'-bis[N,N-bis(4-methoxyphenyl)amino]-9,9-spirobifluorene
N,N'-di(naphthalen-2-yl)-N,N'-diphenybenzene-1,4-diamine
N,N'-diphenyl-N,N'-di-[4-(N,N-ditolylamino)phenyl]-benzidine
N,N'-diphenyl-N,N'-di-[4-(N,N-diphenylamino)phenyl]-benzidine These monomolecular hole transport materials can also be deposited from the liquid phase or be added to the polymeric materials specified below. The film formation properties are improved when low molecular weight and polymeric materials are mixed. The mixing ratios are between 0-100%.

Polymeric hole transporters which are deposited principally from the liquid phase are, by way of example but without restriction: PEDOT, PVK, PTPD, P3HT and PANI (PVK=poly(9-vinylcarbazole), PTPD=poly(N,N'-bis(4-bu-tylphenyl)-N,N'-bis(phenyl)benzidine), P3HT=poly(3-hexy-lthiophene) and PANI=polyaniline); see below:

TABLE 2

FIG. 1. Typical hole-transporting polymers

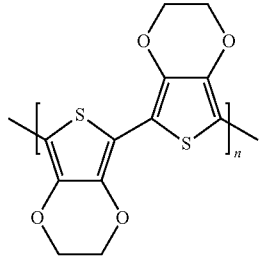

PEDOT = Poly(3,4-ethylenedioxy-thiophene)
CAS: 128213-51-2

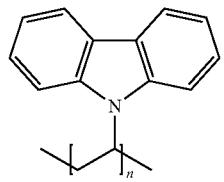

PVK = Poly(9-vinylcarbazole)
CAS: 25087-59-B

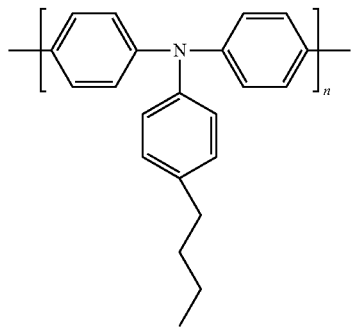

TABLE 2-continued

FIG. 1. Typical hole-transporting polymers

PTPD = Poly(N,N'-bis(4-butylphenyl)-N,N'-bis(phenyl)benzidine

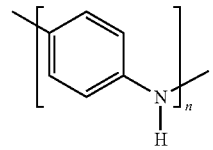

PANI = Polyaniline
CAS: 25233-30-1

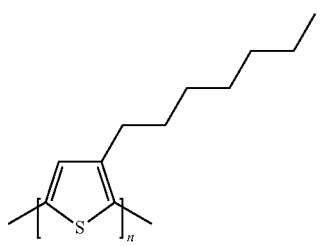

P3HT = Poly(3-hexylthiophene)
CAS: 104934-50-1

Table 2 shows typical hole-transporting polymers which are preferably deposited from the liquid phase.

The materials mentioned may also be present in the form of any desired mixtures.

Useful solvents include the standard organic solvents, but principally chlorobenzene, chloroform, benzene, anisole, toluene, xylene, THF, methoxypropyl acetate, phenetole, methyl ethyl ketone, N-methylpyrrolidone, gamma-butyro-lactone etc.

In a formal sense, the doping can be conceived by coordination of 1-2 hole conductor molecules (NPB here) into the axial positions of the square-planar transition metal complex.

Demonstrated by the example of the copper 2+ complex, this has the following appearance:

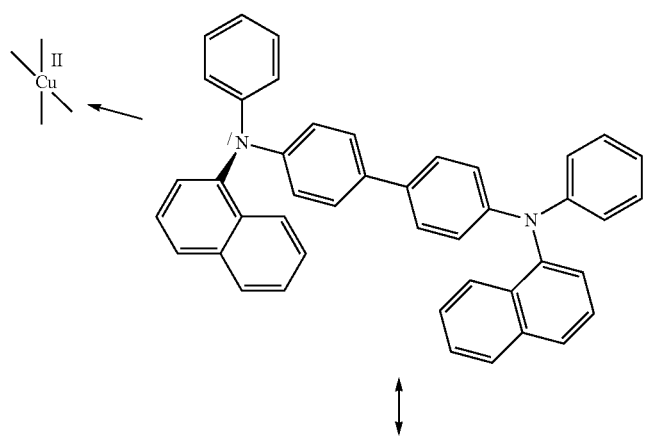

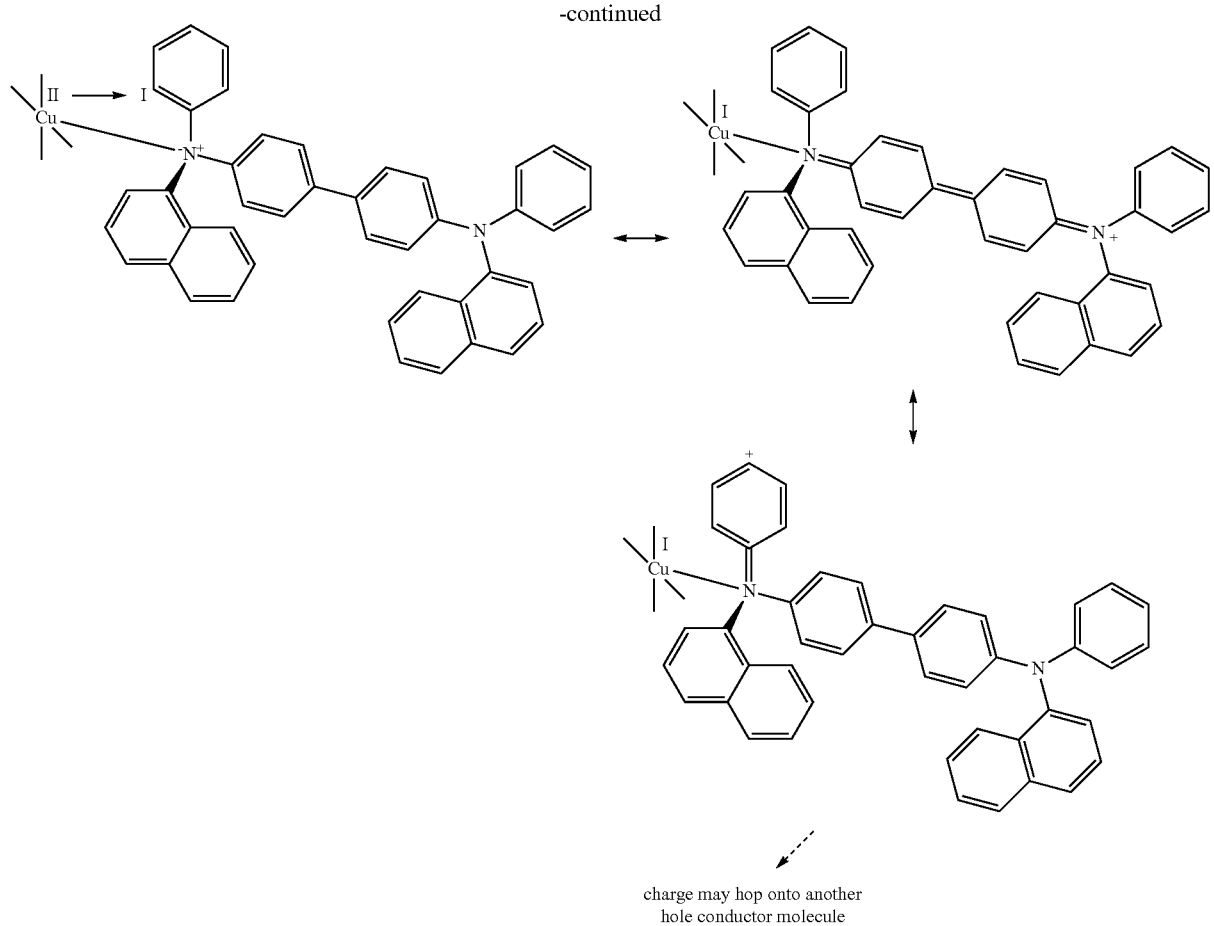

charge may hop onto another
hole conductor molecule

As a result of the dopants shown here for the first time in the form of square-planar transition metal complexes, it is possible for the first time to introduce cheap and readily available compounds into this technique of dopant addition.

For example, many of the copper 2+ compounds are readily available since they are utilized in copper CVD processes in the semiconductor industry. Moreover, the preparation processes are well-established, the dopants are often inexpensive, the components manufactured therewith have a neutral appearance in the switched-off state, and the materials are finally suitable for the deposition of the doped hole conductors from the gas or liquid phase.

The invention is illustrated in detail hereinafter by 5 working examples and FIGS. 1 to 7.

FIG. 1 shows the structure of an OLEEC in schematic form.

An OLED 7 is in most cases formed by a simple introduction of an organic layer 3 between two organic auxiliary layers, an electron transport layer 5 and a hole transport layer 6. This organically active part of the OLED, comprising layers 3, 5 and 6, is then placed between two electrodes 2 and 4. On application of a voltage, light is emitted. The preferably one active emitting layer 3 of an OLED consists of a matrix into which an emitting species has been embedded. Layer 3 also includes a layer stack, for example for the red, green and blue emitter.

Atop the transparent substrate 1 is the lower transparent electrode layer 2, for example the anode. This is followed by the hole transport layer 6, the doping of which is the subject of the present invention. On the opposite side of the organic active layer to the hole conductor layer is the electron injection layer 5 which is adjoined by the upper electrode 4, for example a metal electrode.

The OLED 7 is generally encapsulated, which is not shown here.

Example 1

The five copper acetylacetonates for the doping of the hole conductor layer were sublimed for the purpose of purification and study of the sublimation point in a sublimation system at a base pressure of less than 1.0E-5 mbar. These sublimations gave the results with regard to sublimation temperature and color change of the materials listed in the following table:

TABLE 4

Sublimation points and color properties of the five copper acetylacetonates

| Material | Starting color | Sublimation range | Color after sublimation |
|---|---|---|---|
| $Cu(acac)_2$ | Blue-purple | 110-120° C. | Blue-purple |
| $Cu(tfac)_2$ | Purple | 95-100° C. | Purple |
| $Cu(hfac)_2$ | Dark green | 70° C. @ 1E-2 mbar | Green-black |
| $Cu(fod)_2$ | Green | 60-70° C. | Green |
| $Cu(dpm)_2$ | Purple | 70-80° C. | Purple |

These experiments show that the two materials $Cu(acac)_2$ and $Cu(tfac)_2$ are of good suitability for vacuum processing.

In addition, in this context, the solubility of the five copper acetylacetonates in THF, toluene and chlorobenzene was studied in order to resolve the possibility of solution processing. It was found here that all materials are completely soluble in the solvents mentioned within a short time and hence are also suitable for solution processing.

For example, from chlorobenzene solutions of $Cu(hfac)_2$ were used successfully as a dopant, i.e., with significant doping effect. It was likewise possible to test $Cu(fod)_2$ from solution in chlorobenzene, and a significant doping effect was again observed. The solvent concentrations in both cases were about 1.5% and the layer thickness was 90 to 100 nm.

Example 2

On an ITO (indium tin oxide=tin oxide-doped indium oxide) electrode (lower, transparent electrode 2), a 200 nm-thick layer of the hole conductor NPB (=bis-N,N,N',N'-(naphthylphenyl)benzidine) was deposited by thermal evaporation. The counter electrode used was a 150 nm-thick aluminum layer (upper electrode 4). A component of size 4 mm$^2$ gave the current-voltage characteristic (IV characteristic) marked by black rhombuses, the reference line shown in FIG. 2.

In two further experiments, the dopant $Cu(acac)_2$ was incorporated into NPB in concentrations of 5% and 10% relative to the evaporation rate. Substrates, layer thicknesses and size of the components were as mentioned in the first experiment.

The component with concentration 5% gave the characteristic indicated with squares, and the component with concentration 10% the characteristic marked by triangles.

Figure 2:
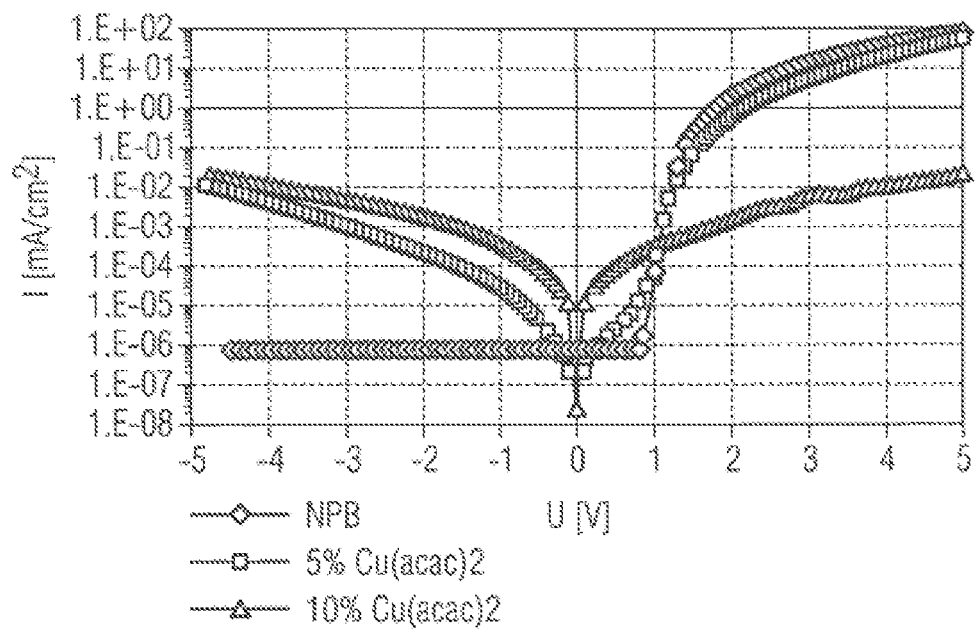
FIGS. 2-7 provide graphic summaries of experiments related to various embodiments of the invention.

FIG. 2 shows the graphic summary of the experiments, i.e., the current-voltage characteristics of NPB (reference line) and NPB doped with $Cu(acac)_2$.

For both concentrations, it can be shown that the doping has an effect on the IV characteristic.

The asymmetric behavior with a slight rise for negative voltages in the 5% characteristic (squares) shows the doping causes an effect in the component, but the concentration selected is insufficient. The symmetric behavior of the 10% characteristic (triangles) is a typical sign of successful doping, but no distinct rise in the current density is evident, specifically for positive voltages.

Example 3

During the experiments from example 2, the undoped NPB layers and the NPB layers doped with $Cu(acac)_2$ were each additionally deposited on a quartz glass wafer. These samples do not have any electrical contacts and serve merely for measurement of absorption and emission spectra of the individual layers.

Figure 3:
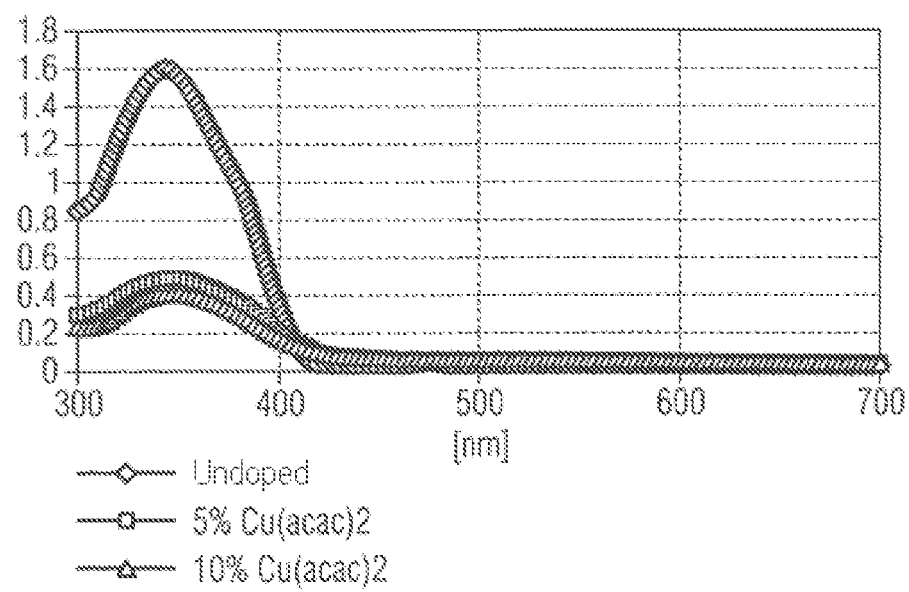
Figure 4:
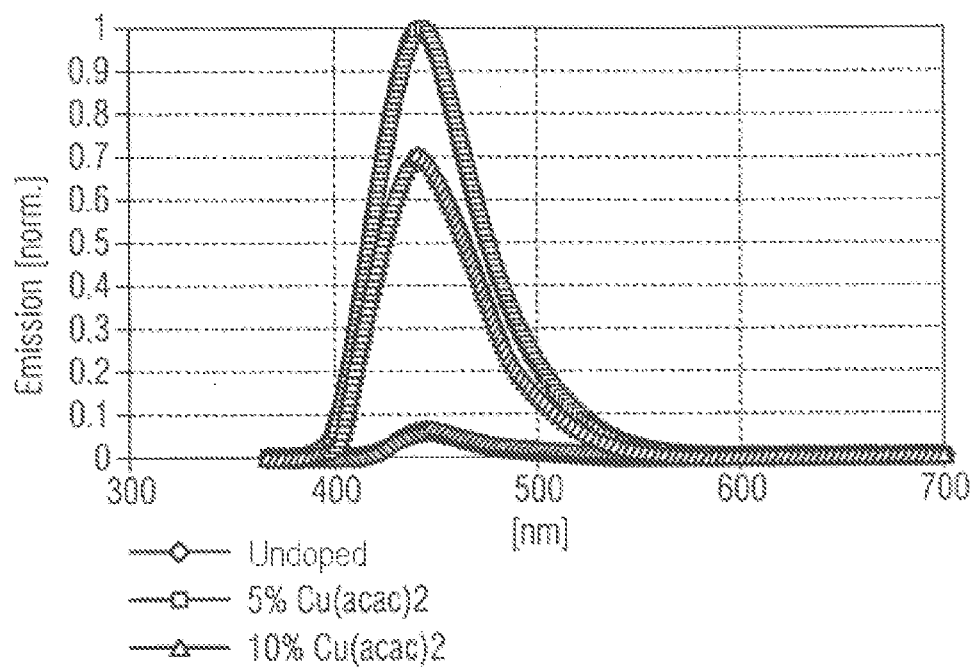

The pure NPB layer (reference line) gave the characteristics for absorption and photoluminescence spectra marked with black rhombuses shown in FIG. 3. The samples with 5% $Cu(acac)_2$ incorporated by doping gave the spectra shown by squares, and the samples with 10% $Cu(acac)_2$ incorporated by doping gave the spectrum marked with triangles.

Compared to the absorption spectra (FIG. 3), it is found that pure NPB has a higher absorption by a factor of 3 at the absorption maximum (344 nm). The layers doped with $Cu(acac)_2$ instead have an absorption increased relative to pure NPB in the range of 410-440 nm. This indicates the formation of a charge transfer complex and hence a doping effect. In the absorption spectrum, the 5% sample has a somewhat higher absorption than the 10% sample, but the two are very close together overall and have the doping effect shown in example 2 by the electrical characteristics.

FIG. 3 shows the absorption spectra of NPB, and NPB doped with $Cu(acac)_2$.

Compared to the PL spectra (FIG. 4), it is found that the samples doped with $Cu(acac)_2$ have a higher emission than the pure NPB sample. At the same time, a minimal shift in emission toward lower wavelengths is observed. Pure NPB emits at 444 nm, while the 5% and 10% doped layers emit at 440 nm and 438 nm respectively. The shift in the emission due to doping can again be explained by the charge transfer complex. What is new here, however, is the emission-enhancing effect of the copper acetylacetonate. An enhancement is unusual in that dopants are actually known as emission inhibitors (quenchers).

Example 4

Analogously to example 2, in two further experiments, the dopant $Cu(tfac)_2$ was incorporated by doping into NPB in concentrations of 5% and 10% relative to the vaporization rate. Substrates, layer thicknesses and size of the components were as mentioned in example 1.

The component with concentration 5% gave the characteristic indicated with squares, and the component with concentration 10% the characteristic marked by triangles. The characteristic marked with black rhombuses again shows the reference component formed from pure NPB.

For both concentrations, a rise in current density is observed, as is a symmetry-like behavior, both of which show presence of a doping effect. The horizontal region of the 5% line here is not a current limit on the part of the component, but is the compliance (measurement limit) of the measuring instrument. The higher current density of the 5% sample compared to the 10% sample shows that the optimum of the dopant concentration is below 10%. The optimal concentration, however, need not necessarily be between 5% and 10%, but may also be lower and may cause an even greater doping effect as a result.

The comparison of the experiments from example 2 with $Cu(acac)_2$ and this example with $Cu(tfac)_2$ shows that fluorination of the ligand in the complex improves the doping effect. It can therefore be assumed that a further improvement is possible with $Cu(hfac)_2$. As already mentioned in example 1, $Cu(hfac)_2$, however, is not an option for vacuum processing, but only for solution processing (see the examples which follow).

Figure 5:
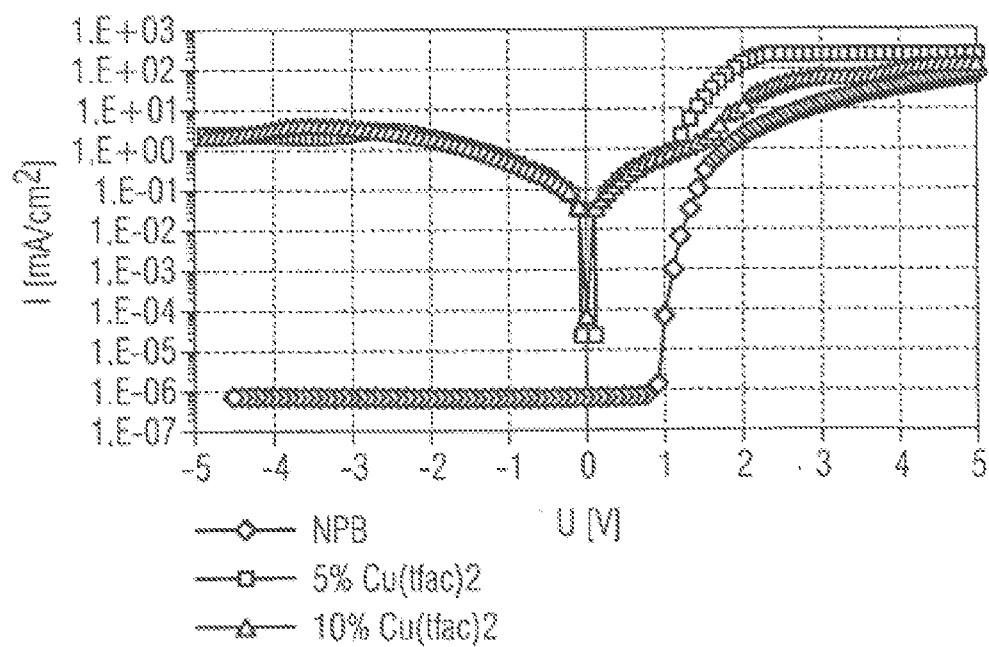

FIG. 5 shows the current-voltage characteristics of NPB, and NPB doped with $Cu(tcac)_2$.

Example 5

During the experiments from example 4, the undoped NPB layers and the NPB layers doped with $Cu(tfac)_2$ were additionally each deposited on a quartz glass wafer. These samples do not have any electrical contacts and serve merely for measurement of absorption and emission spectra of the individual layers.

The pure NPB reference layer gave the characteristics marked with black rhombuses for absorption and photoluminescence spectra. The samples with 5% $Cu(tfac)_2$ incorporated by doping gave the spectra shown by squares, and the samples with 10% $Cu(tfac)_2$ incorporated by doping gave the spectra marked with triangles.

Compared to the absorption spectra (FIG. 6), it is found that pure NPB has an absorption higher by a factor of 3-4 at the absorption maximum (344 nm). The layers doped with Cu(tfac)$_2$ instead have an absorption increased relative to pure NPB in the range of 410-440 nm, and this is then lower than pure NPB again between 450-550 nm. This indicates the formation of a charge transfer complex and hence a doping effect. In the absorption spectra, the 10% sample has a somewhat higher absorption than the 5% sample, but the two overall are much lower than pure NPB and have the doping effect shown in example 4 by the electrical characteristics. The doping effect in example 4 is lower for the 10% sample, and this becomes clear here too by the smaller decline in the absorption compared to the 5% sample.

Compared to the PL spectra (FIG. 7), it is found that the samples doped with Cu(tfac)$_2$ likewise, as in example 3, have a higher emission than the pure NPB sample. At the same time, a shift in the emission toward lower wavelengths is also observed here. Pure NPB emits at 444 nm, while the 5% and 10% doped layers emit at 436 nm and 434 nm respectively. The shift in the emission due to doping is again explained by the charge transfer complex. What is novel again here too is the emission-enhancing effect of the copper acetylacetonate. As already mentioned, an enhancement is actually unusual in that dopants are actually known as emission inhibitors (quenchers).

Figure 6:
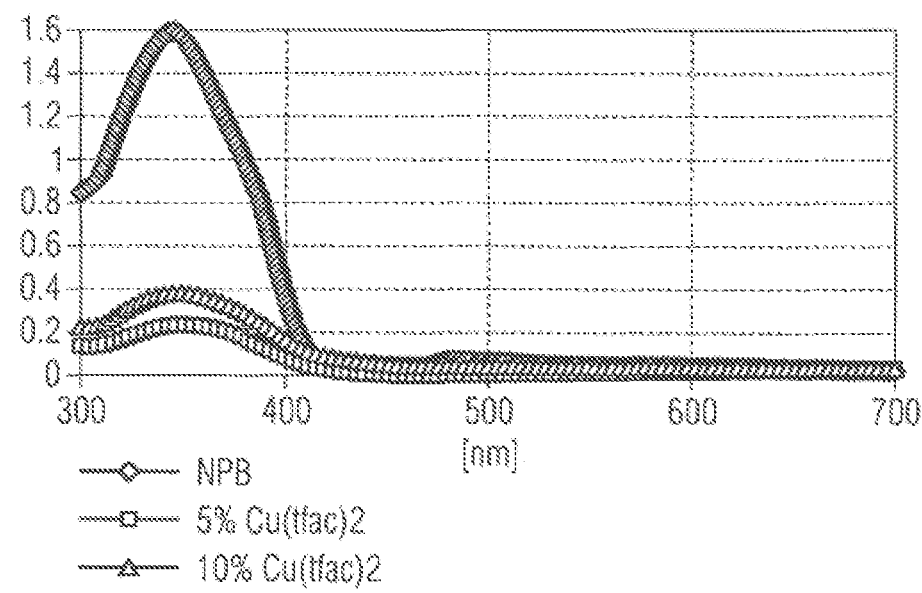

FIG. 6 shows the absorption spectra of NPB, and NPB doped with Cu(tfac)$_2$ in two concentrations.

Figure 7:
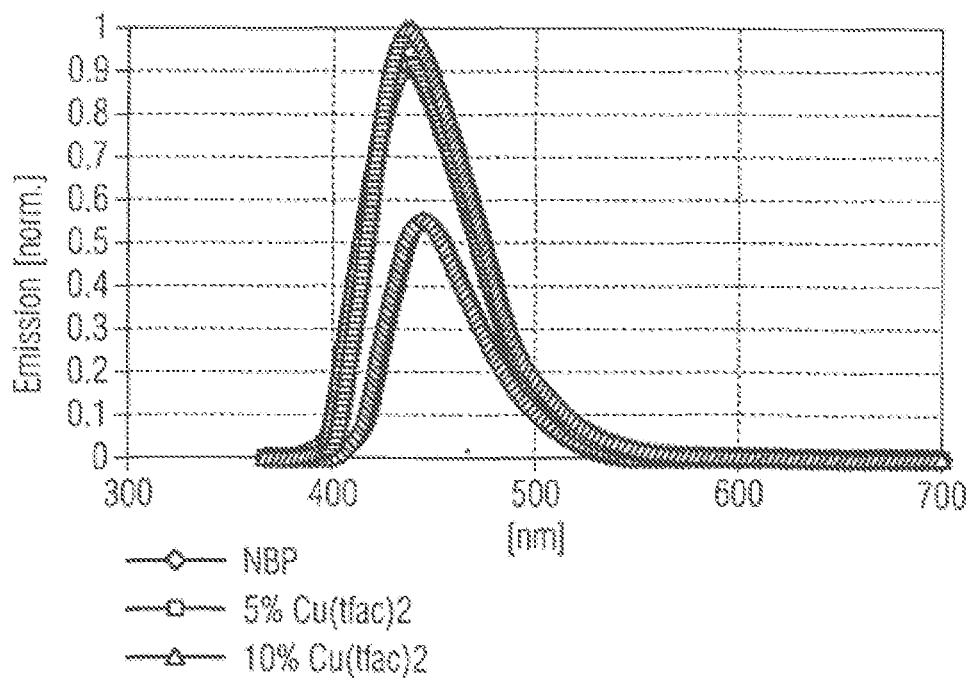

FIG. 7, finally, shows PL spectra of NPB, and NPB doped with Cu(tfac)$_2$.

Luminescence (cd/m$^2$), efficiency (cd/A) and lifetime (h) of organic electronic components, such as, more particularly, of organic light-emitting diodes (FIG. 1), depend significantly on the exciton density in the light-emitting layer and the quality of the charge carrier injection, and are limited by these factors among others. This invention describes a hole injection layer consisting of square-planar mononuclear transition metal complexes, for example of copper 2+ complexes, which are embedded into a hole-conducting matrix.

The invention claimed is:

1. A hole conductor layer for organic electronic components, in which a dopant comprising a mononuclear square-planar transition metal complex comprising a central atom and ligands has been introduced into a hole conductor matrix, and wherein the ligands are selected from the group consisting of acetylacetonate (acac), trifluoroacetylacetonate (tfac), hexafluoroacetylacetonate (hfac), 6,6,7,7,8,8,8-heptafluoro-2,2-dimethyl-3,5-octanedionate (fod), and 2,2,6,6-tetramethyl-3,5-heptanedionate (dpm).

2. The hole conductor layer according to claim 1, wherein the central atom comprises a transition metal selected from the group consisting of Cu, Co, Ni, Pd, and Pt.

3. The hole conductor layer according to claim 1, wherein the hole conductor layer is used in an organic electronic component.

4. An organic electronic component having a doped hole conductor layer, wherein a dopant of the hole doped conductor layer comprises a transition metal complex which is mononuclear and square-planar, and wherein the component comprises an OLEEC.

5. The component according to claim 4, wherein the component is a self-emitting component.

6. An organic electronic component comprising:
a first electrode layer;
a hole transport layer overlying the first electrode layer, wherein the hole transport layer comprises a doped hole conductor layer, wherein a dopant of the hole doped conductor layer comprises a transition metal complex which is mononuclear and square-planar;
wherein the transition metal complex comprises a central atom and ligands, wherein the ligands are selected from the group consisting of acetylacetonate (acac), trifluoroacetylacetonate (tfac), hexafluoroacetylacetonate (hfac), 6,6,7,7,8,8,8-heptafluoro-2,2-dimethyl-3,5-octanedionate (fod), and 2,2,6,6-tetramethyl-3,5-heptanedionate (dpm);
an organic layer overlying the hole transport layer;
an electron transport layer overlying the organic layer; and
a second electrode layer overlying the electron transport layer.

7. The component according to claim 6, wherein the central atom comprises a transition metal selected from the group consisting of Cu, Co, Ni, Pd, and Pt.

8. The component according to claim 6, wherein the component is a self-emitting component.

9. The component according to claim 6, wherein the component comprises an organic light emitting diode.

10. An organic electronic component comprising:
a first electrode layer;
a hole transport layer overlying the first electrode layer, wherein the hole transport layer comprises a doped hole conductor layer, wherein a dopant of the hole doped conductor layer comprises a transition metal complex which is mononuclear and square-planar;
an organic layer overlying the hole transport layer, wherein the organic layer comprises an active emitting layer that is configured to emit light upon application of a voltage and wherein the organic layer comprises a layer stack including a red, green and blue emitter;
an electron transport layer overlying the organic layer; and
a second electrode layer overlying the electron transport layer.

* * * * *